(12) United States Patent
Iwanaga (10) Patent No.: US 10,795,224 B2
(45) Date of Patent: Oct. 6, 2020

(54) CURVED DISPLAY APPARATUS

(71) Applicant: Mitsubishi Electric Corporation, Tokyo (JP)

(72) Inventor: Hirofumi Iwanaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/281,673

(22) Filed: Feb. 21, 2019

(65) Prior Publication Data

US 2019/0278126 A1 Sep. 12, 2019

(30) Foreign Application Priority Data

Mar. 6, 2018 (JP) ................................ 2018-039308

(51) Int. Cl.
*G02F 1/1345* (2006.01)
*G02F 1/1333* (2006.01)
*H05K 1/02* (2006.01)

(52) U.S. Cl.
CPC ...... *G02F 1/13458* (2013.01); *G02F 1/13452* (2013.01); *G02F 1/13454* (2013.01); *G02F 1/133305* (2013.01); *H05K 1/0277* (2013.01)

(58) Field of Classification Search
CPC ........... G02F 1/133305; G02F 1/13452; G02F 1/13454; G02F 1/13458; G02F 2001/13456
See application file for complete search history.

(56) References Cited

U.S. PATENT DOCUMENTS

| | | | | |
|---|---|---|---|---|
| 7,115,980 B2 * | 10/2006 | Miyagawa | .......... | G02F 1/13452 257/678 |
| 9,568,788 B2 | 2/2017 | Shibahara | | |
| 9,836,161 B2 * | 12/2017 | Nakano | ................. | G06F 3/0412 |
| 2015/0173171 A1 * | 6/2015 | Kim | ...................... | G06F 1/1652 361/749 |
| 2015/0189755 A1 * | 7/2015 | Choi | ...................... | H05K 1/028 361/749 |
| 2016/0219706 A1 * | 7/2016 | Jo | .......................... | H05K 1/118 |

FOREIGN PATENT DOCUMENTS

| | | |
|---|---|---|
| JP | 2010-008479 A | 1/2010 |
| JP | 2010145896 | * 7/2010 |
| JP | 2013-134295 A | 7/2013 |
| JP | 2013-235241 A | 11/2013 |
| JP | 2015-225092 A | 12/2015 |
| WO | 2014002779 A1 | 1/2014 |

\* cited by examiner

*Primary Examiner* — Dung T Nguyen
(74) *Attorney, Agent, or Firm* — Studebaker & Brackette PC (57) ABSTRACT

A curved display apparatus includes a display panel curved along a first direction, and an FPC board used for driving the display panel. The FPC board is connected to a side of a curved side of the display panel. The FPC board is provided with the slits for reducing the stress applied to the FPC board.

9 Claims, 11 Drawing Sheets

CURVED DISPLAY APPARATUS

BACKGROUND OF THE INVENTION

Field of the Invention

The present invention relates to a curved display apparatus including a curved display panel.

Description of the Background Art

In recent years, a curved display apparatus including a curved display panel has been developed. Japanese Patent Application Laid-Open No. 2010-008479 discloses a configuration (hereinafter, also referred to as a "related configuration A") in which a plurality of FPC (Flexible Printed Circuits) boards are connected to a curved side of a curved display panel.

In the configuration in which the FPC boards are connected to the curved side of the display panel, a stress is applied to each of the FPC boards. When the stress applied to the FPC board is large, there is a possibility that a trouble may occur in the FPC board. Therefore, it is required to reduce the stress applied to the FPC board. Since the related configuration A is to reduce the stress applied to a board (printed wiring board) connected to the FPC board, it is impossible to satisfy the requirement.

SUMMARY

An object of the present invention is to provide a curved display apparatus capable of reducing a stress applied to an FPC board.

A curved display apparatus according to one aspect of the present invention includes a display panel curved along a first direction and an FPC (Flexible Printed Circuits) board used for driving the display panel, wherein the display panel has a curved side that is a side included in a contour of the display panel and is a side curved along the first direction, the FPC board is connected to a side of the curved side of the display panel, and the FPC board is provided with a slit for reducing a stress applied to the FPC board.

According to the present invention, the FPC board is connected to the side of the curved side of the display panel. The FPC board is provided with the slit for reducing the stress applied to the FPC board. Thereby, the stress applied to the FPC board can be reduced.

These and other objects, features, aspects and advantages of the present invention will become more apparent from the following detailed description of the present invention when taken in conjunction with the accompanying drawings.

DESCRIPTION OF THE PREFERRED EMBODIMENT

Hereinafter, a preferred embodiment of the present invention will be described with reference to the drawings. In the following drawings, the same components are denoted by the same reference signs. Names and functions of the components denoted by the same reference sign are the same. Therefore, detailed descriptions of a part of the components denoted by the same reference sign may not be repeated.

It should be noted that dimensions, a material, a shape, relative arrangement of each of the components, and the like exemplified in the preferred embodiment may be appropriately changed according to a configuration of an apparatus to which the present invention is applied, various conditions, and the like. Moreover, the dimensions of each of the components in each of the drawings may be different from actual dimensions.

First Preferred Embodiment

Figure 1:
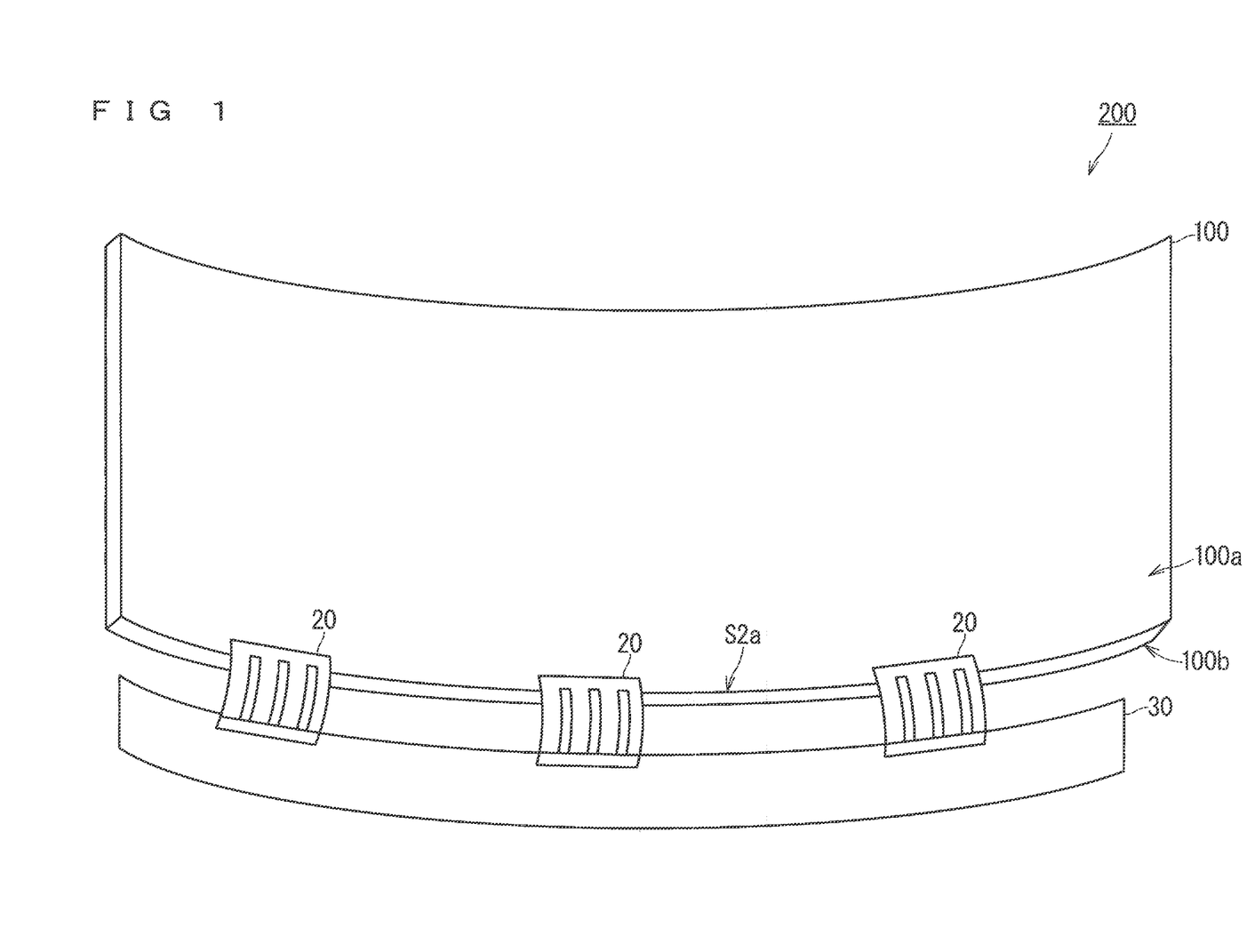
FIG. 1 is a view showing a configuration of a curved display apparatus according to a first preferred embodiment.

FIG. 1 is a view showing a configuration of a curved display apparatus 200 according to a first preferred embodiment. The curved display apparatus 200 is, for example, a liquid crystal display apparatus that operates using liquid crystal.

Referring to FIG. 1, the curved display apparatus 200 includes a display panel 100, a circuit board 30, and a plurality of FPC boards 20. In FIG. 1, as an example, three FPC boards 20 are shown. The number of the FPC boards 20 included in the curved display apparatus 200 is not limited to three, and may be one, two, four, or more. In FIG. 1, the FPC boards 20 are shown in a simplified manner.

The display panel 100 is, for example, a liquid crystal panel that displays a video, using liquid crystal. The display panel 100 is, for example, a COG (Chip on Glass) type panel. Note that the display panel 100 may be a panel other than a COG type panel.

Figure 2:
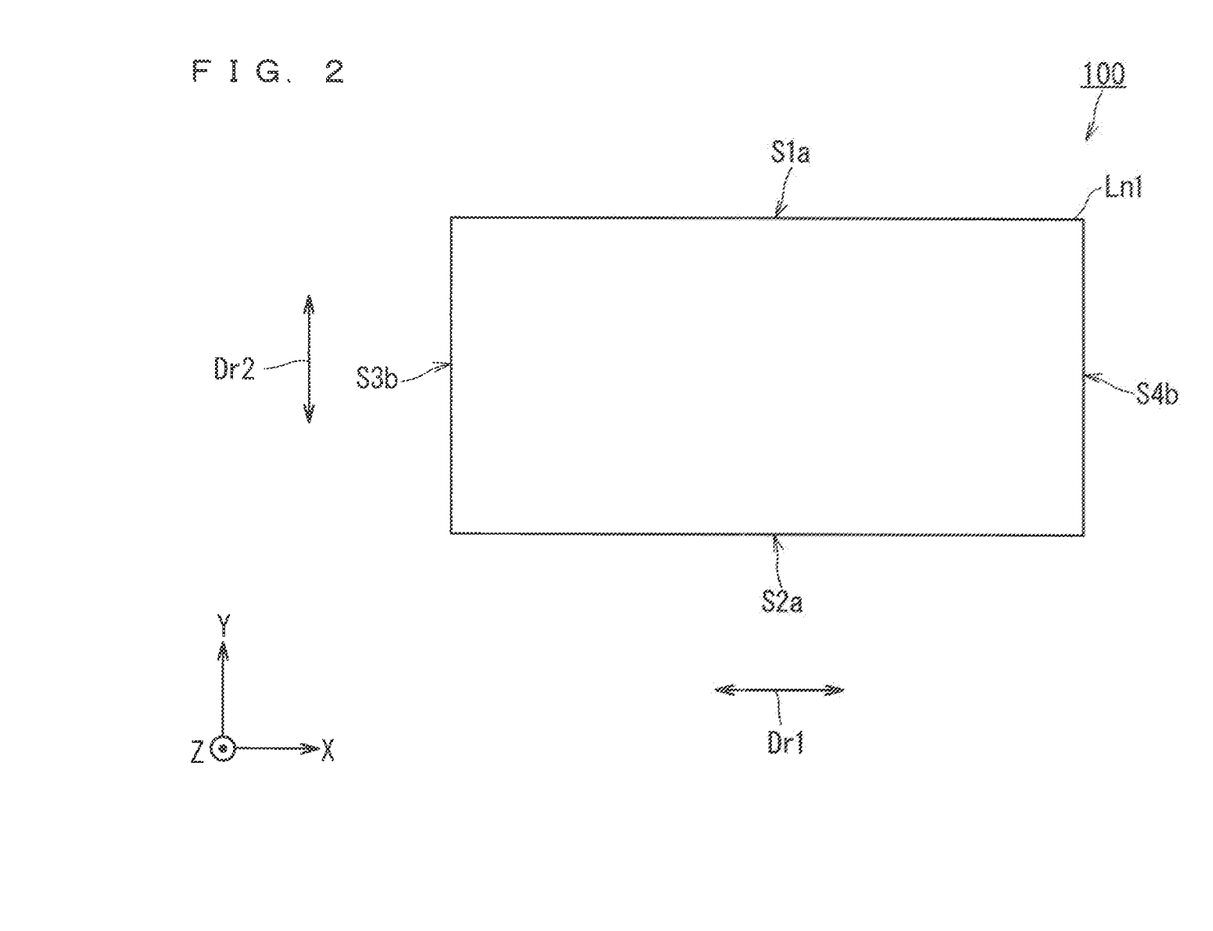
FIG. 2 is a plan view of a display panel according to the first preferred embodiment.

FIG. 2 is a plan view of the display panel 100 according to the first preferred embodiment. In FIG. 2, an X direction, a Y direction, and a Z direction are orthogonal to one another. An X direction, a Y direction, and a Z direction shown in the subsequent figures are also orthogonal to one another. In the following description, a direction including the X direction and a direction opposite to the X direction (−X direction) is also referred to as an "X axis direction". Moreover, in the following description, a direction including the Y direction and a direction opposite to the Y direction (−Y direction) is also referred to as a "Y axis direction". In the following description, a direction including the Z direction and a direction opposite to the Z direction (−Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Referring to FIGS. 1 and 2, the display panel 100 has a front surface 100*a* and a rear surface 100*b*. Glass is provided on a front surface 100*a* side and a rear surface 100*b* side of the display panel 100.

The display panel 100 is curved along a direction Dr1. In the present preferred embodiment, the direction Dr1 is the X axis direction. Hereinafter, a direction orthogonal to the direction Dr1 in a plan view (XY plane) is also referred to as a "direction Dr2". In the present preferred embodiment, the direction Dr2 is the Y axis direction.

A contour Ln1 of the display panel 100 has a rectangular shape. The contour Ln1 includes sides S1*a*, S2*a*, S3*b*, and S4*b*. Each of the sides S1*a* and S2*a* is curved along the direction Dr1.

In the following description, each of the side S1*a* and the side S2*a* is also referred to as a "curved side". The display panel 100 has the curved sides (sides S1*a* and S2*a*). In the following description, the side that is not curved is also referred to as a "non-curved side". Each of the side S3*b* and the side S4*b* is a non-curved side.

Each of the FPC boards 20 has flexibility. In the following description, the state of the FPC board 20 in the case where the FPC board 20 is curved along the direction Dr1 is also referred to as a "curved state". A stress (bending stress) is applied to the FPC board 20 in the curved state. In the following description, the state of the FPC board 20 in the case where the FPC board 20 is not curved is also referred to as a "non-curved state".

Outer shapes of the plurality of FPC boards 20 in the non-curved state are the same. Further, a shape of each of the plurality of FPC boards 20 in a plan view (XY plane) is rectangular (oblong).

Each of the FPC boards 20 is connected to the display panel 100 and the circuit board 30. Each of the FPC boards 20 is connected to a side of the curved side (side S2*a*) of the display panel 100. Therefore, each of the FPC boards 20 is curved along the direction Dr1.

An ACF (Anisotropic Conductive Film) is used for connecting each of the FPC boards 20 and the display panel 100. Each of the FPC boards 20 is connected to a driver IC (not shown) mounted on the display panel 100.

The circuit board 30 has a function of driving the display panel 100 via each of the FPC boards 20. Therefore, each of the FPC boards 20 is a board used for driving the display panel 100. A connector (not shown) is provided on the circuit board 30.

Figure 3A:
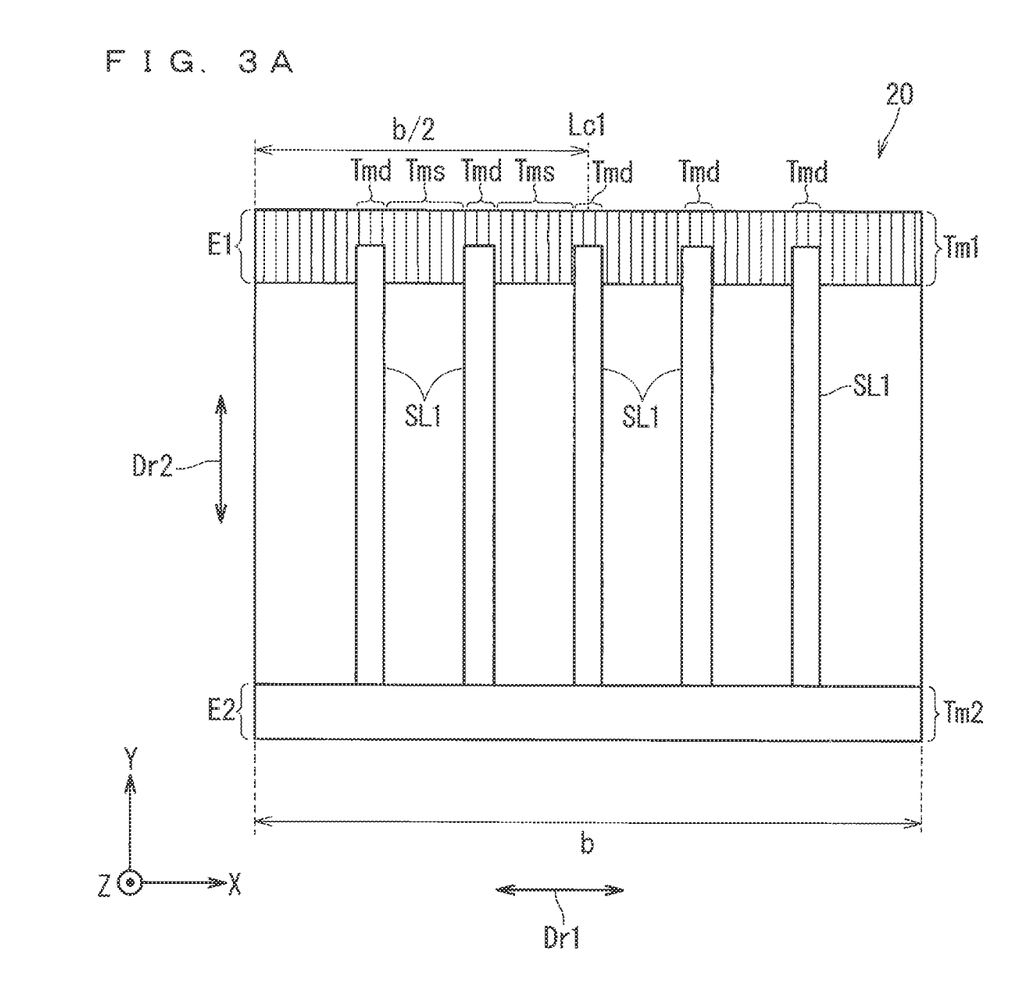
FIGS. 3A and 3B are views for describing a configuration of an FPC board according to the first preferred embodiment.
Figure 3B:
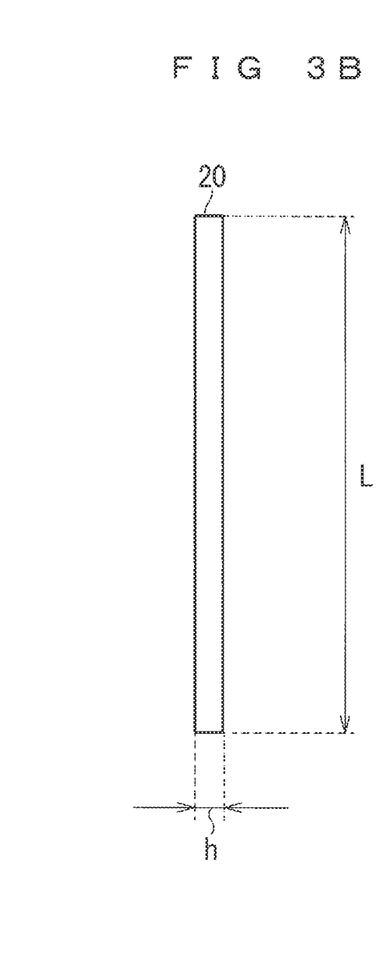

FIGS. 3A and 3B are views for describing a configuration of the FPC board 20 according to the first preferred embodiment. In addition, FIGS. 3A and 3B show the FPC board 20 in a non-curved state. FIG. 3A is a plan view of the FPC board 20. FIG. 3B is a side view of the FPC board 20.

The FPC board 20 has a width b, a length L and a thickness h. The FPC board 20 has an end portion E1 and an end portion E2, which intersect with the direction Dr2. The end portion E1 is provided with a terminal portion Tm1. The terminal portion Tm1 (end portion E1) is connected to the front surface 100*a* of the display panel 100 via the ACF.

The end portion E2 is provided with a terminal portion Tm2. The terminal portion Tm2 (end portion E2) is connected to the circuit board 30. Specifically, the terminal portion Tm2 is connected to a connector (not shown) of the circuit board 30. Therefore, the terminal portion Tm2 is connected to the circuit board 30 with the connector. Note that the terminal portion Tm2 is electrically connected to the terminal portion Tm1 by wiring (not shown). As a result, signals such as a control signal, a voltage signal and the like are supplied from the circuit board 30 to the display panel 100 via the FPC board 20.

The FPC board 20 is provided with k slits SL1. "K" is a natural number equal to or larger than 1. In the present preferred embodiment, "k" is, for example, five. In FIG. 3A, five slits SL1 are shown as one example. The number of the slits SL1 included in the FPC board 20 is not limited to five, and may be one to four, or six or more.

Each of the slits SL1 is an elongated through hole. Each of the slits SL1 extends from the terminal portion Tm1 to the end portion E2 (terminal portion Tm2). One end portion of each of the slits SL1 extends to an inside of the terminal portion Tm1.

One of the slits SL1 included in the k slits SL1 is provided in a central portion (position Lc1) of the FPC board 20 in the direction Dr1. A length from a left end of the FPC board 20 to the position Lc1 in the direction Dr1 is b/2.

Further, the terminal portion Tm1 has k dummy terminals Tmd and a plurality of signal terminals Tms. In the direction Dr1, the dummy terminals Tmd and the signal terminals Tms are alternately provided. The signal terminals Tms are terminals for transmitting signals.

Each of the dummy terminals Tmd is a terminal that does not have a function of transmitting a signal such as the control signal or the voltage signal or the like. The dummy terminal Tmd is made of, for example, an insulator. In the direction Dr2, the k dummy terminals Tmd are adjacent to k slits SL1, respectively.

Figure 4:
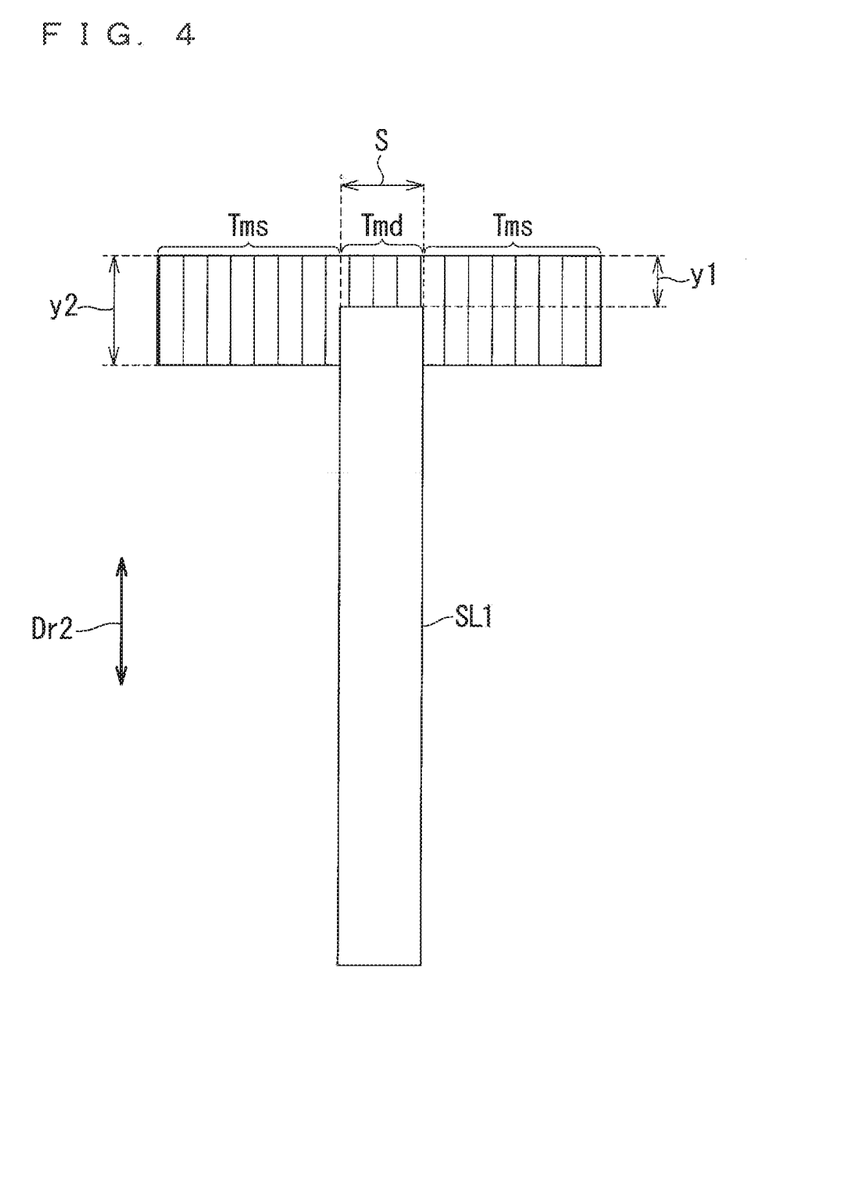
FIG. 4 is a view for describing a dummy terminal according to the first preferred embodiment.

FIG. 4 is a view for describing the dummy terminal Tmd according to the first preferred embodiment. FIG. 4 is an enlarged view of a part of FIG. 3A. Referring to FIG. 4, a length y1 of the dummy terminal Tmd in the direction Dr2 is equal to or less than a half of a length y2 of the signal terminal Tms in the direction Dr2. A width S of the dummy terminal Tmd is the same as a width of the slit SL1.

The stress (bending stress) applied to the FPC board 20 in a curved state is proportional to the width of the FPC board 20. Therefore, by providing the slits SL1 in the FPC board 20 as shown in FIG. 3A, it is possible to reduce the stress applied to the FPC board 20 in the curved state.

Furthermore, the configuration of the present preferred embodiment in the case where the width b of the FPC board 20 is set to a sufficient length is equivalent, in terms of mounting limitation and mounting time, to a conventional configuration in which a plurality of divided FPC boards are mounted.

As the number of the slits SL1 in the FPC board 20 is increased, the stress applied to each of the plurality of signal terminals Tms included in the terminal portion Tm1 can be reduced in the FPC board 20 in the curved state.

Further, as the length y1 of the dummy terminal Tmd in the FPC board 20 is shortened, the stress applied to each of the plurality of signal terminals Tms included in the terminal portion Tm1 can be reduced in the FPC board 20 in the curved state.

Here, the stress applied to the terminal portion Tm1 will be described. In the following description, the FPC board not having the slit SL1 is also referred to as an "FPC board 20N". The FPC board 20N is different from the FPC board 20 only in that it does not have the slit SL1.

Figures 8A, 8B, 8C:
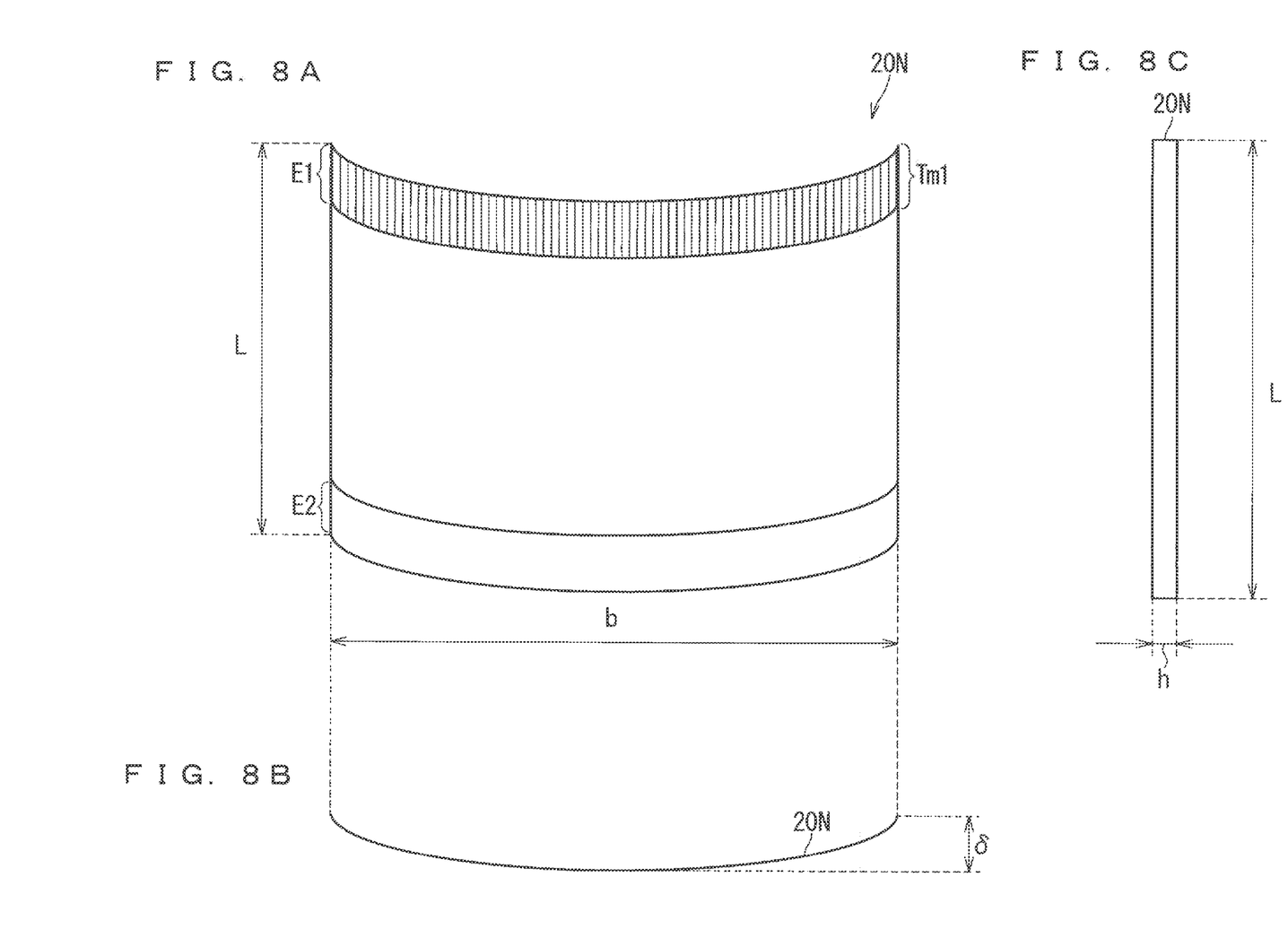
FIGS. 8A to 8C are views for describing a stress applied to the FPC board.

If the FPC board 20N is connected to a display panel that is not curved, the stress applied to the terminal portion Tm1 is substantially zero. However, if the FPC board 20N is connected to a side of a curved side of a curved display panel having a curvature R, the FPC board 20N is curved as shown in FIG. 8A. In this case, warp amounts of a plurality of different regions in the terminal portion Tm1 are different. The warp amount is a degree of a warp (curving).

FIG. 8A is a view showing the FPC board 20N in a curved state. FIG. 8B is a side view of the FPC board 20N in the curved state. FIG. 8C is a side view of the FPC board 20N in a non-curved state. In the following description, a maximum warp amount possessed by the FPC board 20N is expressed as a "warp amount δ" or "δ". The warp amount δ is a warp amount in a range from a center of the FPC board 20N to an end of the FPC board 20N as shown in FIG. 8B. Here, it is assumed that the FPC board 20N has a width b, a length L, and a thickness h. In this case, the stress σ applied to the FPC board 20N in the curved state can be calculated by the following Expression 1.

[Expression 1]

$$\sigma = 4 \times \delta \times E \times b \times h^3 / L^3 \quad (1)$$

In Expression 1, E is a Young's modulus. Further, the warp amount δ of the FPC board 20N having the curvature R can be calculated by the following Expression 2.

[Expression 2]

$$\delta = R - \cos(90 \times b / \pi R) \quad (2)$$

As the curvature R decreases and b increases, the warp amount δ increases. Also, as the warp amount δ increases, the stress σ increases.

By setting the stress σ to be equal to or lower than a holding force (adhesive force) of the terminal portion Tm1 connected to the display panel 100 via the ACF, the FPC board is less likely to peel off from the display panel 100. Therefore, by setting the width b, the length L, and the thickness h of the FPC board at optimal values, it is possible to obtain an FPC board that has achieved an improvement in signal transmission efficiency, a cost reduction, and the like.

In the following description, the stress σ applied to the FPC board 20N in the curved state is also referred to as a "stress σn" or "σn".

Here, consider the following premise Pm1. In the premise Pm1, the display panel 100 included in the curved display apparatus 200 in FIG. 1 has the curvature R. That is, in the premise Pm1, the plurality of FPC boards 20 are connected to the side of the curved side (side S2a) of the display panel 100 having the curvature R.

Figure 5A:
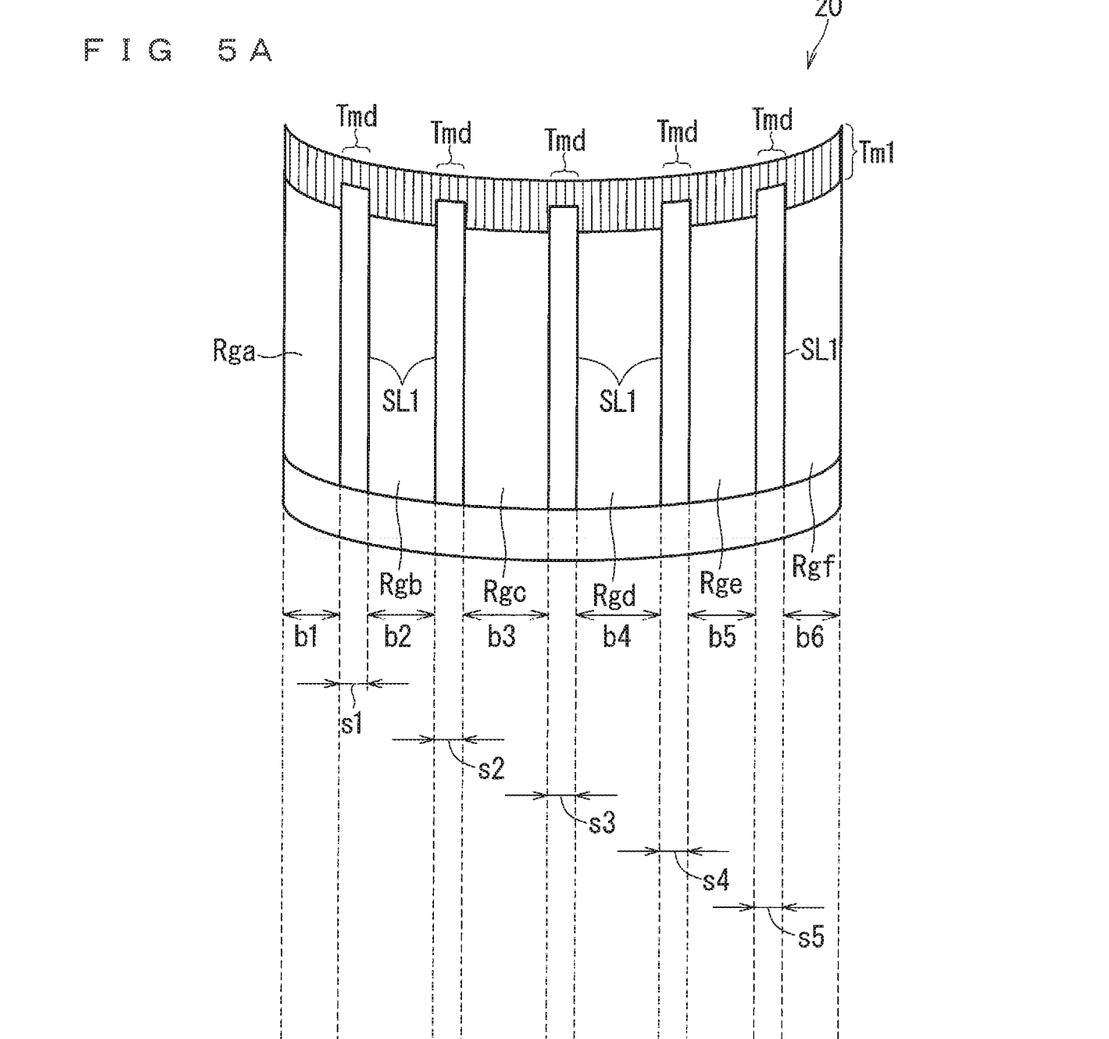
FIGS. 5A and 5B are views for describing a stress applied to the FPC board in a curved state.
Figure 5B:
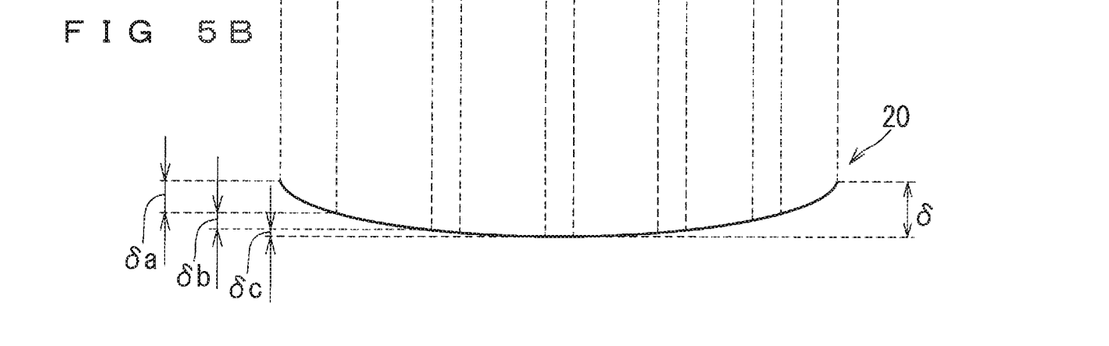

Next, the FPC board 20 in the premise Pm1 will be described with reference to FIGS. 5A and 5B. FIGS. 5A and 5B are views for describing the stress applied to the FPC board 20 in the premise Pm1. FIG. 5A is a view showing the FPC board 20 in the curved state. FIG. 5B is a side view of the FPC board 20 of FIG. 5A.

The FPC board 20 has regions Rga, Rgb, Rgc, Rgd, Rge, and Rgf. A width of a part of the FPC board 20, which corresponds to between two adjacent slits SL1 included in the five slits SL1, is any of the widths b1, b2, b3, b4, b5, and b6. The five slits SL1 have widths s1, s2, s3, s4, and s5, respectively.

In the following description, a stress applied to the terminal portion Tm1 inside the region Rga is expressed as a "stress σa" or "σa". In the following description, a warp amount of the terminal portion Tm1 inside the region Rga is expressed as a "warp amount δa" or "δa". The stress σa can be calculated by the following Expression 3.

[Expression 3]

$$\sigma a = 4 \times \delta a \times E \times b1 \times h^3 / L^3 \quad (3)$$

Note that δa in Expression 3 is a value obtained from Expression 2. In addition, a stress applied to each of the regions Rgb, Rgc, Rgd, Rge, and Rgf can also be calculated by an expression similar to Expression 3 for calculating the stress σa.

Further, the warp amount δ of the FPC board 20 is smaller than the warp amount δ of the FPC board 20N. By providing the k slits SL1 in the FPC board 20, the stress applied to each of the regions Rga, Rgb, Rgc, Rgd, Rge, and Rgf is sufficiently smaller than the stress σn applied to the FPC board 20N. That is, each of the slits SL1 is a component that reduces the stress applied to the FPC board 20.

Figure 6A:
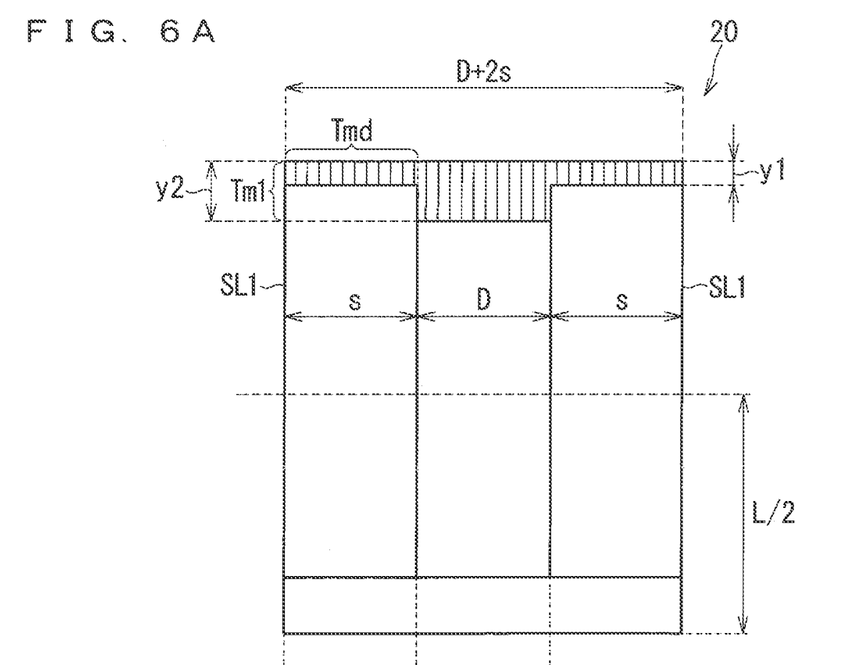
FIGS. 6A to 6C are views for describing a stress applied to the dummy terminal.
Figure 6B:
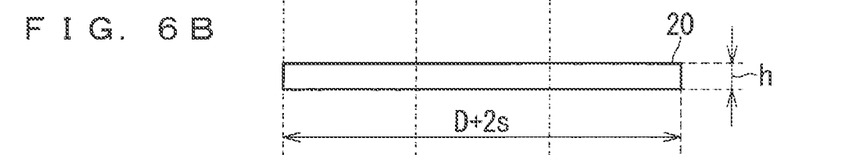
Figure 6C:
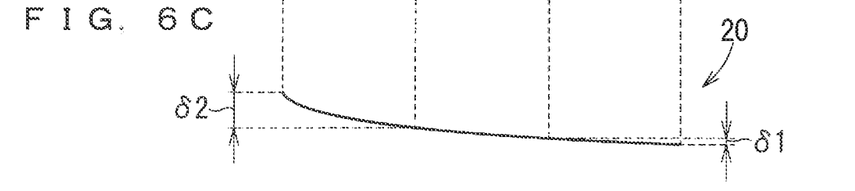

Next, a stress applied to the dummy terminal Tmd, which is the portion adjacent to the slit SL1 in the FPC board 20, will be described. FIGS. 6A to 6C are views for describing the stress applied to the dummy terminal Tmd. FIG. 6A is a view showing a part of the FPC board 20 of FIG. 5A. FIG. 6B is a side view of the FPC board 20 in the non-curved state. FIG. 6C is a side view of the FPC board 20 of FIG. 6A.

In the following description, the width of the slit SL is denoted as "s". Moreover, in the following description, an interval between two adjacent slits SL1 is denoted as "D". In the following description, the stress applied to the dummy terminal Tmd is expressed as a "stress σs" or "σs". In the following description, the warp amount of the dummy terminal Tmd is expressed as a "warp amount δ2" or "δ2". The stress σs can be calculated by the following Expression 4.

[Expression 4]

$$\sigma s = 4 \times \delta 2 \times E \times s \times h / y1^3 \quad (4)$$

By providing the slits SL1 in the FPC board 20, the warp amount δ2 is smaller than the warp amount of the dummy terminal Tmd of the FPC board 20N. Therefore, the stress σs is smaller than the stress applied to the dummy terminal Tmd of the FPC board 20N.

The smaller a value of y1 is, the larger the stress σs is. Therefore, it is possible to reduce the stress σs by setting parameters of Expression 4 to the values with which the stress σs is equal to or smaller than an adhesive force (holding force) of the dummy terminal Tmd.

As described above, according to the present preferred embodiment, the FPC board 20 is connected to the side of the curved side (side S2a) of the display panel 100. The FPC board 20 is provided with the slits SL for reducing the stress applied to the FPC board 20. Thereby, the stress applied to the FPC board can be reduced.

In addition, since the slits SL1 are present in the FPC board 20, the stress applied to the FPC board 20 in the curved state can be reduced. Therefore, it is possible to suppress occurrence of a trouble in the FPC board 20 in the curved state. The trouble is, for example, a trouble that the FPC board 20 peels off from the display panel 100. Further, the trouble is, for example, a trouble that the wiring of the FPC board 20 is broken.

Further, according to the present preferred embodiment, one end portion of each of the slits SL1 extends to the inside of the terminal portion Tm1. With the slits SL1 thus arranged, the stress applied to the terminal portion Tm1 of the FPC board 20 in the curved state can be reduced. Thus, occurrence of disconnection or the like in the terminal portion Tm1 can be suppressed.

Further, according to the present preferred embodiment, as shown in FIG. 3A, each of the slits SL1 extends from the terminal portion Tm1 to the end portion E2 (terminal portion Tm2). Therefore, the configuration of the present preferred embodiment is equivalent, in terms of the mounting limitation and the mounting time, to the conventional configuration in which the plurality of divided FPC boards are mounted.

Further, according to the present preferred embodiment, the outer shapes of the plurality of FPC boards 20 are the same. Thus, a cost of the curved display apparatus can be reduced.

Figure 9:
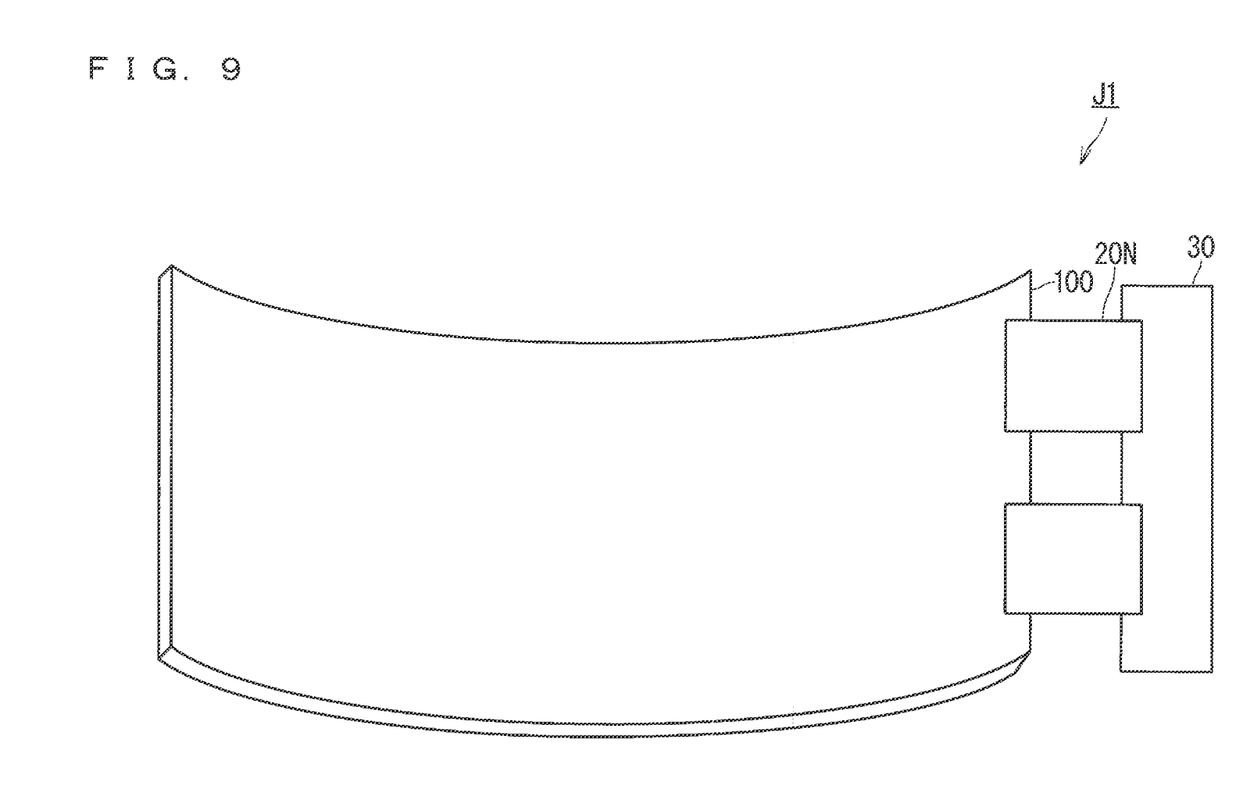
FIG. 9 is a view showing a configuration of a curved display apparatus as a comparative example.

Here, a comparative example to be compared with the present preferred embodiment will be described. In the following description, a curved display apparatus in the comparative example is also referred to as a "curved display apparatus J1". FIG. 9 is a view showing a configuration of the curved display apparatus J1 as the comparative example. The curved display apparatus J1 is different from the curved display apparatus 200 only in that the plurality of FPC boards 20N are provided instead of the plurality of FPC boards 20. Since the other part of the configuration of the curved display apparatus J1 is the same as that of the curved display apparatus 200, a detailed description will not be repeated.

In the curved display apparatus J1 of FIG. 9, the plurality of FPC boards 20N are connected to a side of the non-curved side (side S4b) of the display panel 100. In the configuration of FIG. 9, almost no stress (bending stress) is applied to the FPC boards 20N connected to the display panel 100.

Figure 10:
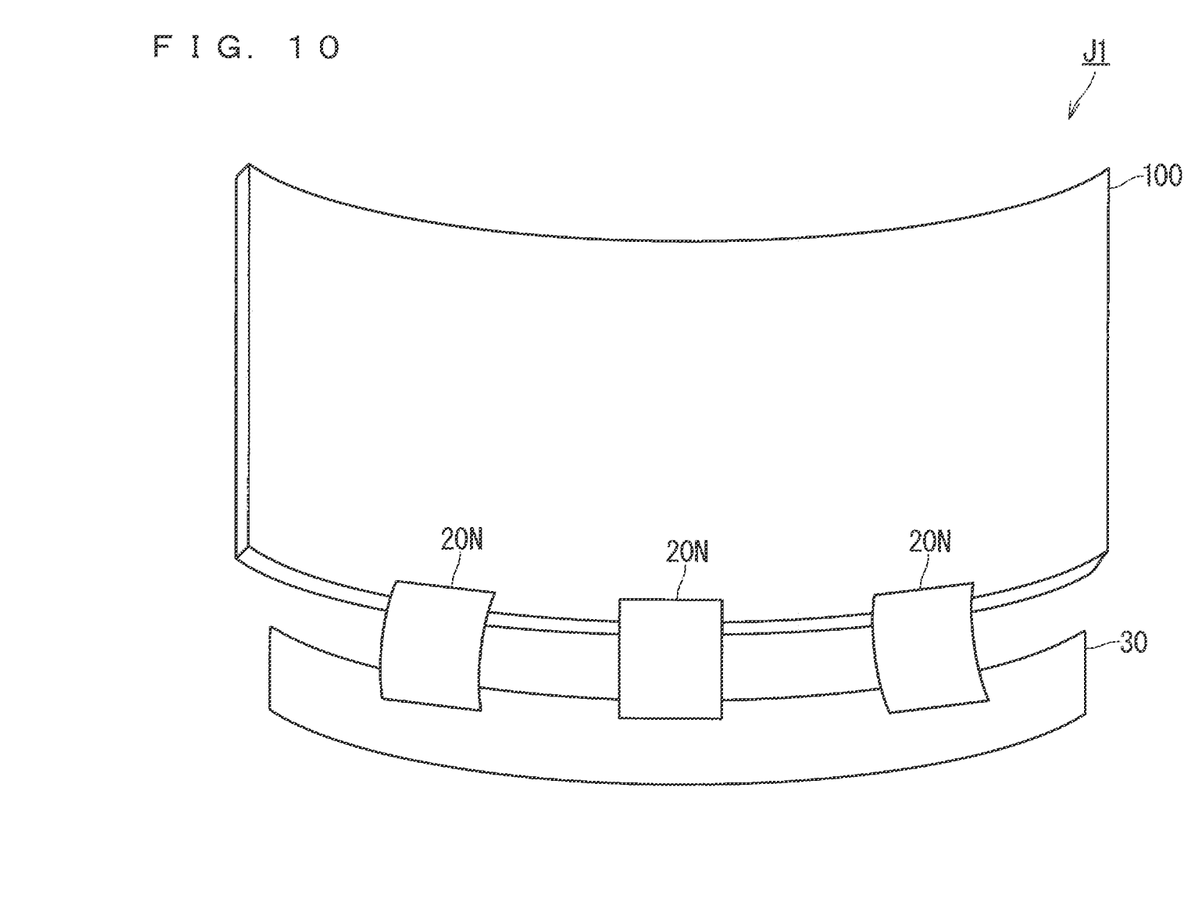
FIG. 10 is a view showing another configuration of the curved display apparatus as a comparative example.

FIG. 10 is a view showing another configuration of the curved display apparatus J1 as a comparative example. In the curved display apparatus J1 of FIG. 10, the plurality of FPC boards 20N are connected to the side of the curved side (side S2a) of the display panel 100. Each of the FPC boards 20N has the configuration and shape shown in FIG. 8. The circuit board 30 in FIG. 10 is curved.

In addition, since each of the FPC boards 20N is curved, a stress is applied to each of the FPC boards 20N. Therefore, there is a technique (hereinafter, also referred to as a "related art Ar1") for making the outer shapes of the FPC boards 20N different so that the stress applied to each of the FPC boards 20N is reduced.

Figure 11:
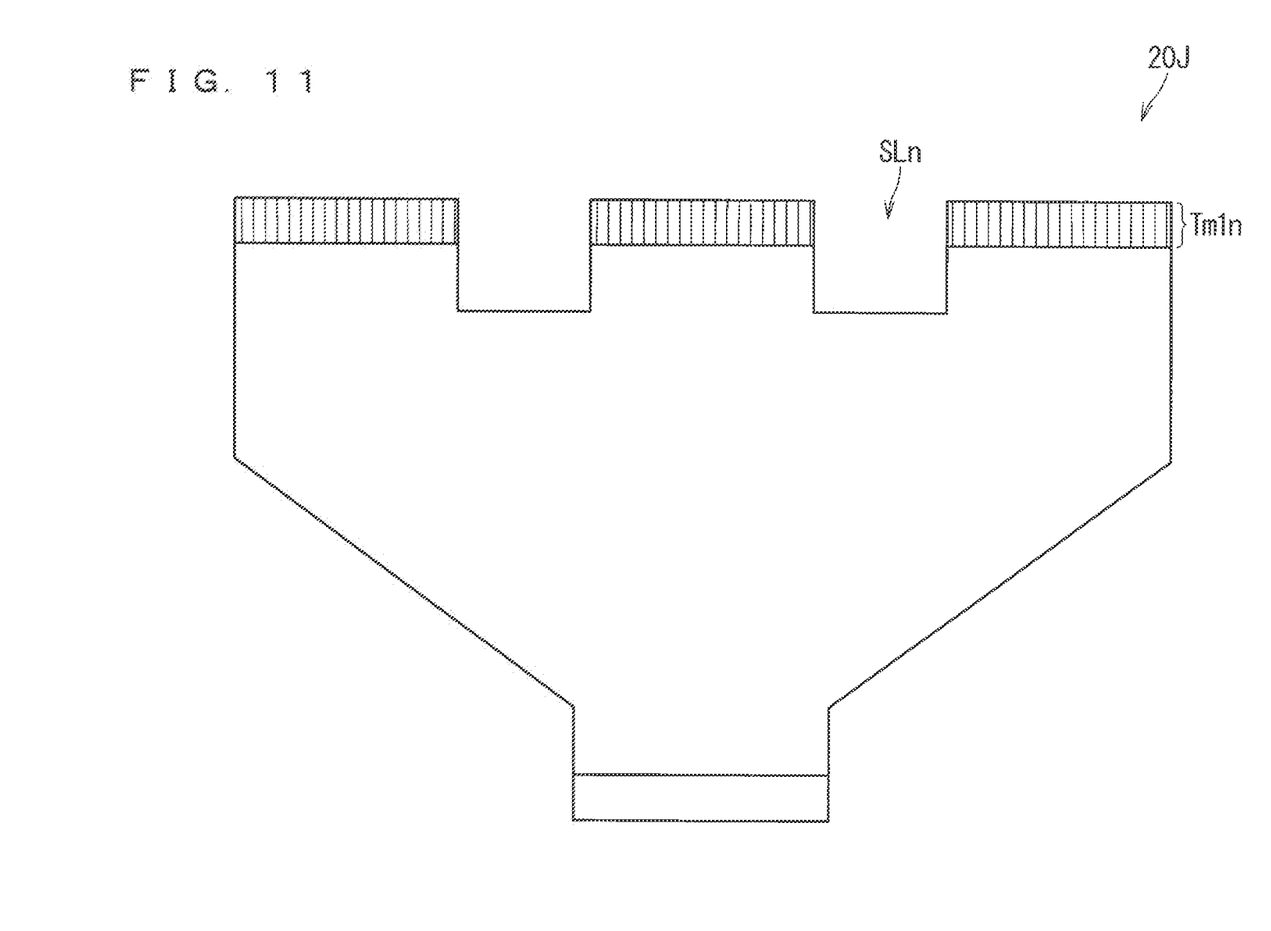
FIG. 11 is a view showing a configuration of an FPC board as a comparative example.

FIG. 11 is a view showing a configuration of an FPC board 20J as a comparative example. The FPC board 20J is provided with a terminal portion Tm1n. The terminal portion Tm1n is connected to the display panel. A slit SLn is provided at an end portion of the FPC board 20J where the terminal portion Tm1n is present. The FPC board 20J is connected to the display panel in each terminal block. When connecting a plurality of FPC boards 20J to the display panel all at once, there is a problem that portions to which the plurality of FPC boards 20J are connected possibly deviate from desired positions.

When the FPC board 20N is connected to a side of the curved side of the display panel 100 as in the curved display apparatus J1 of FIG. 10, the FPC board 20N is curved along the direction Dr1. As a result, a stress is applied to the FPC board 20N. As the curvature of the display panel 100 is smaller, the stress applied to the FPC board 20N is larger. When a large stress is applied to the FPC board 20N, there is a possibility that the terminal portion Tm1 of the FPC board 20N peels off from the display panel 100.

In some cases, the curved FPC board 20N may be required to be curved along the direction Dr2, as needed. For example, when the FPC board 20N is curved along the direction Dr2 so that the end portion E1 overlaps the end portion E2 in a plan view (XY plane), a large stress is applied to the curved portion of the FPC board 20N.

In this case, there is a problem that the following trouble N may occur. The trouble N is, for example, a trouble that the wiring of the FPC board 20N is broken. The trouble N is, for example, a trouble that the terminal portion Tm1 peels off the display panel 100.

A configuration is also conceivable in which the outer shapes of the FPC boards 20N are made different so that the stress applied to each of the FPC boards 20N is reduced as in the related art Ar1. However, the configuration of the related art Ar1 has a problem of high cost.

There is also a method of dividing the FPC board 20N into a plurality of parts to reduce the stress applied to the FPC board 20N. However, according to the method, there are some problems, including a problem that limitation arises when the FPC board 20N is connected to the display panel and a problem that it takes time to connect the FPC board 20N.

Therefore, the curved display apparatus 200 of the present preferred embodiment has the configuration for achieving the above-described effects. Therefore, each of the above problems can be solved.

<First Modification>

In the following description, the configuration of the first preferred embodiment is also referred to as a "configuration Ct1". In the following description, a configuration of the present modification is also referred to as a "configuration Ctm1". The configuration Ctm1 has a configuration in which a slit SL2 is further provided in the FPC board 20. The slit SL2 is a slit extending in the direction Dr1. The configuration Ctm1 is applied to the configuration Ct1 (the first preferred embodiment).

Figure 7A:
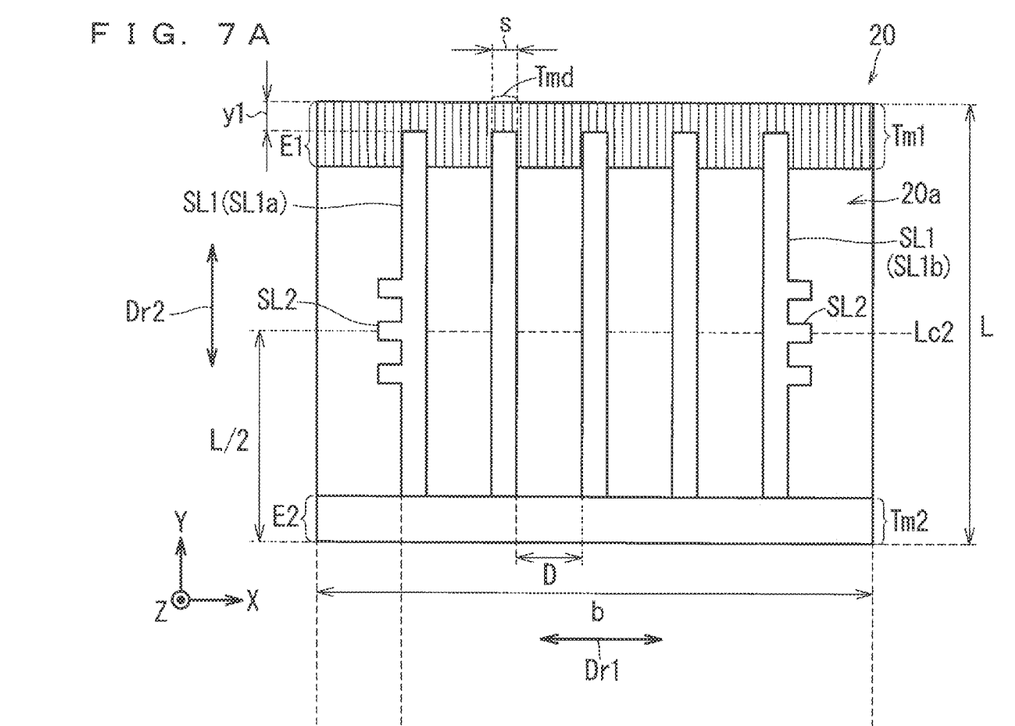
FIGS. 7A to 7C are views for describing a configuration of the FPC board according to a first modification.
Figure 7B:
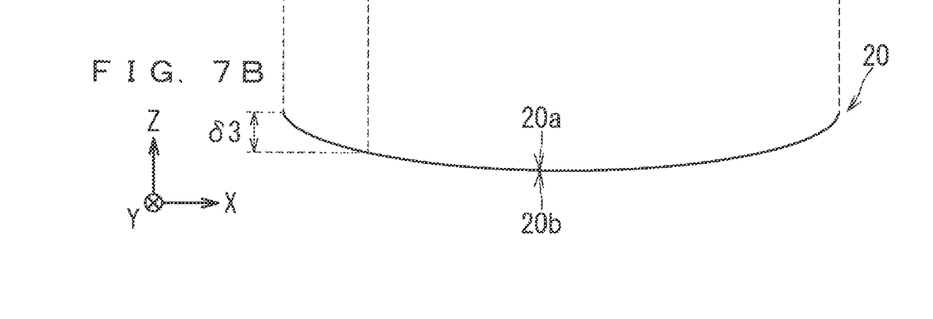
Figure 7C:
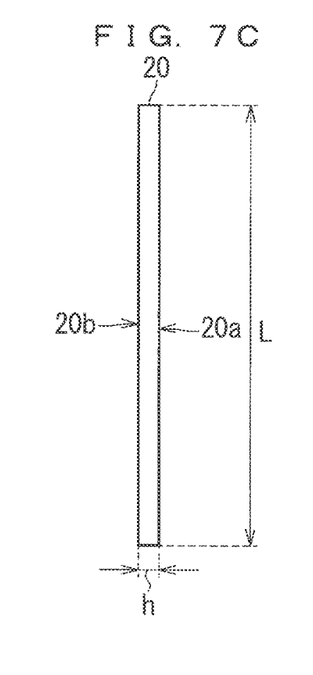

FIGS. 7A to 7C are views for describing the configuration of the FPC board 20 according to the first modification. FIG. 7A is a plan view of the FPC board 20 in a curved state. FIG. 7B is a side view of the FPC board 20 in the curved state. FIG. 7C is a side view of the FPC board 20 in a non-curved state. The FPC board 20 has a front surface 20a and a rear surface 20b.

Here, consider the following premise Pm2. In the premise Pm2, the FPC board 20 in the curved state is curved along the direction Dr2 so that the end portion E1 overlaps the end portion E2 in a plan view (XY plane). Specifically, the FPC board 20 in the curved state is curved along the direction Dr2 so that the end portion E1 exists above the end portion E2 in a plan view (XY plane). In the premise Pm2, the FPC board 20 is curved so that a position Lc2 is the center of curvature.

In the premise Pm2, a force Pw1a along the direction Dr1 and a force Pw1b along the direction Dr2 are applied as stresses to the front surface 20a of the FPC board 20 in the curved state. The force Pw1a is a force that contracts the front surface 20a in the direction Dr1. The force Pw1b is a force that extends the front surface 20a in the direction Dr2.

In the premise Pm2, a force Pw2a along the direction Dr1 and a force Pw2b along the direction Dr2 are applied as stresses to the rear surface 20b of the FPC board 20 in the curved state. The force Pw2a is a force that extends the rear surface 20b in the direction Dr1. The force Pw2b is a force for contracting the rear surface 20b in the direction Dr2.

In the configuration Ctm1 in the premise Pm2, the FPC board 20 in the curved state is further curved along the direction Dr2 so that the end portion E1 overlaps the end portion E2 in a plan view (XY plane). The FPC board 20 in the curved state is the FPC board 20 curved along the direction Dr1.

In the configuration Ctm1 in the premise Pm2, the FPC board 20 is curved along the direction Dr2 so that the end portion E2 of the FPC board 20 is present on a rear surface 100b side of the display panel 100.

In the following description, the state of the FPC board 20 in the case where the FPC board 20 is curved along the direction Dr2 so that the end portion E1 overlaps the end portion E2 in a plan view is also referred to as a "curved state W".

In the configuration Ctm1, the slit SL2 is provided in the FPC board 20 in order to reduce the stresses (forces Pw1b, Pw2b) applied to the FPC board 20 in the curved state W. Specifically, in the configuration Ctm1, the slit SL2 is provided in the central portion (position Lc2) of the FPC board 20 in the direction Dr2. The slit SL2 may be further provided at a position other than the central portion (position Lc2) of the FPC board 20 in the direction Dr2 as shown in FIG. 7A.

In the following description, among the k slits SL1 of the FPC board 20, the slit SL1 closest to the left end of the FPC board 20 is also referred to as a "slit SL1a". In the following description, among the k slits SL1 of the FPC board 20, the slit SL1 closest to a right end of the FPC board 20 is also referred to as a "slit SL1b".

In the configuration Ctm1, the slit SL2 is provided so that the slit SL2 is connected to the slit SL1a. Further, in the configuration Ctm1, the slit SL2 is provided so that the slit SL2 is connected to the slit SL1b.

As described above, according to the present modification, the slit SL2 is provided in the central portion (position Lc2) of the FPC board 20 in the direction Dr2. Thereby, the stress (forces Pw1b and Pw2b) applied to the FPC board 20 in the curved state W can be reduced.

Note that the slit SL2 may also be provided for the slit SL1 other than the slits SL1a and SL1b among the k slits SL1. By increasing the number of the slits SL2 provided in the FPC board 20, it is possible to further reduce the stresses (forces Pw1b and Pw2b).

It should be noted that, within the scope of the present invention, the preferred embodiment and the modifications of the present invention may be freely combined, and/or may be appropriately modified or omitted.

For example, the display panel 100 is not limited to a liquid crystal panel, and may be a panel of another type having flexibility. The display panel 100 may be, for example, an organic EL (Electroluminescence) panel.

Further, for example, the curved display apparatus 200 is not limited to a liquid crystal display apparatus, and may be a display apparatus of another type. The curved display apparatus 200 may be, for example, an organic EL display apparatus using an organic EL panel.

While the invention has been shown and described in detail, the foregoing description is in all aspects illustrative and not restrictive. It is therefore understood that numerous modifications and variations can be devised without departing from the scope of the invention.

What is claimed is:

1. A curved display apparatus comprising:
    a display panel curved along a first direction; and
    an FPC (Flexible Printed Circuits) board used for driving the display panel, wherein
    the display panel has a curved side that is a side included in a contour of the display panel and is a side curved along the first direction,
    the FPC board is connected to a side of the curved side of the display panel,
    the FPC board is provided with a slit for reducing a stress applied to the FPC board,
    the FPC board has a first end portion and a second end portion that intersect with a second direction orthogonal to the first direction in a plan view,
    the first end portion is connected to the display panel,
    the first end portion is provided with a terminal portion,
    the terminal portion has a dummy terminal not having a function of transmitting a signal, and
    the slit extends from the dummy terminal of the terminal portion to the second end portion.

2. The curved display apparatus according to claim 1, wherein the slit is provided in a central portion of the FPC board in the first direction.

3. The curved display apparatus according to claim 1, wherein
    the second end portion is connected to a circuit board.

4. The curved display apparatus according to claim 1, wherein
    the terminal portion further includes a signal terminal for transmitting a signal, and
    a length of the dummy terminal in the second direction is equal to or less than a half of a length of the signal terminal in the second direction.

5. The curved display apparatus according to claim 1, wherein
    the FPC board is curved along the second direction, and
    in a central portion of the FPC board in the second direction, another slit extending in the first direction is provided.

6. The curved display apparatus according to claim 1, wherein
    the FPC board is curved along the first direction, and
    the FPC board is further curved along the second direction so that the first end portion overlaps the second end portion in a plan view.

7. The curved display apparatus according to claim 1, wherein
    the display panel has a front surface and a rear surface,
    the first end portion is connected to the front surface of the display panel, and
    the FPC board is curved along the second direction so that the second end portion is present on a rear surface side of the display panel.

8. The curved display apparatus according to claim 1, wherein
    the second end portion is provided with another terminal portion, and
    the another terminal portion is connected to a circuit board with a connector.

9. The curved display apparatus according to claim 1, further comprising a plurality of FPC boards including the FPC board, wherein
    outer shapes of the plurality of FPC boards are the same, and
    each of the plurality of FPC boards has a rectangular shape.

* * * * *